United States Patent
Bunce et al.

(10) Patent No.: US 9,281,024 B2
(45) Date of Patent: Mar. 8, 2016

(54) WRITE/READ PRIORITY BLOCKING SCHEME USING PARALLEL STATIC ADDRESS DECODE PATH

(71) Applicant: International Business Machines Corporation, Armonk, NY (US)

(72) Inventors: Paul A. Bunce, Poughkeepsie, NY (US); Yuen H. Chan, Poughkeepsie, NY (US); John D. Davis, Maybrook, NY (US); Diana M. Henderson, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 14/255,509

(22) Filed: Apr. 17, 2014

(65) Prior Publication Data

US 2015/0302902 A1    Oct. 22, 2015

(51) Int. Cl.
*G11C 7/10* (2006.01)
*G11C 8/10* (2006.01)
*G11C 8/16* (2006.01)

(52) U.S. Cl.
CPC ............ *G11C 7/10* (2013.01); *G11C 7/1051* (2013.01); *G11C 7/1075* (2013.01); *G11C 8/10* (2013.01); *G11C 8/16* (2013.01)

(58) Field of Classification Search
CPC .......... G11C 8/16; G11C 7/1075; G11C 7/10; G11C 7/1051; G11C 8/10
See application file for complete search history.

(56) References Cited

U.S. PATENT DOCUMENTS

| | | | |
|---|---|---|---|
| 5,021,688 A | 6/1991 | Leforestier et al. | |
| 5,287,323 A * | 2/1994 | Takahashi et al. | 365/230.05 |
| 5,717,653 A | 2/1998 | Suzuki | |
| 6,049,487 A * | 4/2000 | Plants et al. | 365/189.04 |
| 6,243,287 B1 | 6/2001 | Naffziger et al. | |
| 6,725,325 B2 * | 4/2004 | Nishiyama et al. | 711/104 |

(Continued)

FOREIGN PATENT DOCUMENTS

| | | |
|---|---|---|
| EP | 1456757 A2 | 9/2004 |
| JP | 2007012128 A | 1/2007 |

(Continued)

OTHER PUBLICATIONS

List of IBM Patents or Patent Applications Treated as Related; Sep. 30, 2014, pp. 1-2.

(Continued)

*Primary Examiner* — Douglas King
(74) *Attorney, Agent, or Firm* — Cantor Colburn LLP; Margaret McNamara

(57) ABSTRACT

A write block read apparatus for a memory device includes a dynamic read address decoder that receives static read address bits as inputs thereto and having an output used to implement a read operation of a memory location corresponding to the read address bits; a dynamic write address decoder that receives static write address bits as inputs thereto and having an output used to implement a write operation of a memory location corresponding to the write address bits; and a static write address decoder, configured in parallel with the dynamic write address decoder, the static write address decoder configured to receive a portion of the static write address bits as inputs thereto, and wherein the static write address decoder is coupled to the dynamic read address decoder so as to block the read operation upon an address conflict with the write operation.

8 Claims, 4 Drawing Sheets

(56) References Cited

U.S. PATENT DOCUMENTS

| | | | |
|---|---|---|---|
| 6,826,088 | B2 | 11/2004 | Sohn et al. |
| 2002/0031043 | A1 | 3/2002 | Tsuruto et al. |
| 2004/0027857 | A1* | 2/2004 | Ooishi .................. 365/185.11 |
| 2004/0095830 | A1 | 5/2004 | Tanaka |
| 2006/0291283 | A1 | 12/2006 | Jin et al. |
| 2010/0232250 | A1 | 9/2010 | Bull et al. |
| 2011/0310691 | A1* | 12/2011 | Zhou et al. ............ 365/230.03 |

FOREIGN PATENT DOCUMENTS

| | | |
|---|---|---|
| KR | 1020020054209 A | 7/2002 |
| KR | 102007002841 A | 1/2007 |

OTHER PUBLICATIONS

Paul A. Bunce, et al., "Write/Read Priority Blocking Scheme Using Parallel Static Address Decode Path," U.S. Appl. No. 14/501,078, filed Sep. 30, 2014.

B. Akesson, et al., "Composability and Predictability for Independent Application Development, Verification, and Execution", Multiprocessor System-on-Chip: Hardware Design and Tool Integration, Chapter 2, Springer New York, 2011, pp. 25-56.

Jianhui Yue, et al., "Making Write Less Blocking for Read Accesses in Phase Change Memory", Modeling, Analysis & Simulation of Computer and Telecommunication Systems (MASCOTS), IEEE 20TH International Symposium, 2012, pp. 269-277.

* cited by examiner

WRITE/READ PRIORITY BLOCKING SCHEME USING PARALLEL STATIC ADDRESS DECODE PATH

BACKGROUND

The present invention relates generally to integrated circuit memory devices and, more particularly, to a write/read priority blocking scheme using a parallel static address decode path.

Generally, electronic circuits have significant data storage capacities. Such capacities may be achieved with large memories formed of several memory blocks for physical or logical reasons. For example, such memories may include SRAM (Static Random-Access Memory) or DRAM (Dynamic Access Memory). A memory controller enables the other functions of the electronic circuit to view all the memory blocks as a single memory, in terms of address.

In one implementation, memory blocks may have a single-port architecture. In other words, as seen from the other electronic circuit functions, a single-port block can only perform one read operation or one write operation at a time. This memory block architecture avoids the need for overly complex memory architectures or architectures consuming too much circuit surface area. On the other hand, it may sometimes be desirable for some functions of the electronic circuit to simultaneously perform a read operation and a write operation. In this case, other architectures, such as two-port, dual-port, and multiple port cells have also become popular.

For memory architectures performing address decoding that are presented with both read and write addresses at the same bank of logical entries, a banking function can be performed, which enables simultaneous read and write operations to different memory banks. In the case of multiport arrays, simultaneous reads to any logical entry can be achieved. However, in the case of a bank conflict where a request is made for simultaneous read and write to the same logical bank, a decision must be made to determine whether the access will be a read or a write. This decision can be made external to the memory array, in which case the desired address is simply sent to the memory without a conflict; however, the memory array could also perform this function with the appropriate logic if it is known whether reading or writing takes priority.

In the case of a write access taking priority over a read access, the write address can be used to prevent a full read address decode when the read and write addresses are the same. One approach would be to use the actual write decode in the critical decode path for the address blocking; however, this would introduce timing complexity in the critical path, specifically loading down the partially decoded write MSB signals with additional wire and device load. As a result, the write decode path timing would start to differ from that of the read decode path, and such a difference would worsen across process variations.

SUMMARY

In an exemplary embodiment, a write block read apparatus for a memory device includes a dynamic read address decoder that receives static read address bits as inputs thereto and having an output used to implement a read operation of a memory location corresponding to the read address bits; a dynamic write address decoder that receives static write address bits as inputs thereto and having an output used to implement a write operation of a memory location corresponding to the write address bits; and a static write address decoder, configured in parallel with the dynamic write address decoder, the static write address decoder configured to receive a portion of the static write address bits as inputs thereto, and wherein the static write address decoder is coupled to the dynamic read address decoder so as to block the read operation upon an address conflict with the write operation.

BRIEF DESCRIPTION OF THE SEVERAL VIEWS OF THE DRAWINGS

Referring to the exemplary drawings wherein like elements are numbered alike in the several Figures.

DETAILED DESCRIPTION

As indicated above, in the case of a write access taking priority over a read access, the write address can be used to prevent a full read address decode when the read and write addresses are the same. Such a scheme is utilized in embodiments disclosed herein, where a version of the write decode is used to block the read address from fully decoding. That is, embodiments herein disclose utilizing a replicated, partially decoded version of the write address to block the read address from completing its decode when the write and read addresses access the same logical bank. Unlike the above described approach of using the actual write decode in the critical decode path, the present scheme maintains the existing dynamic decode hierarchy for memory access, thus generating predictable timing behavior in the critical path.

Figure 1:
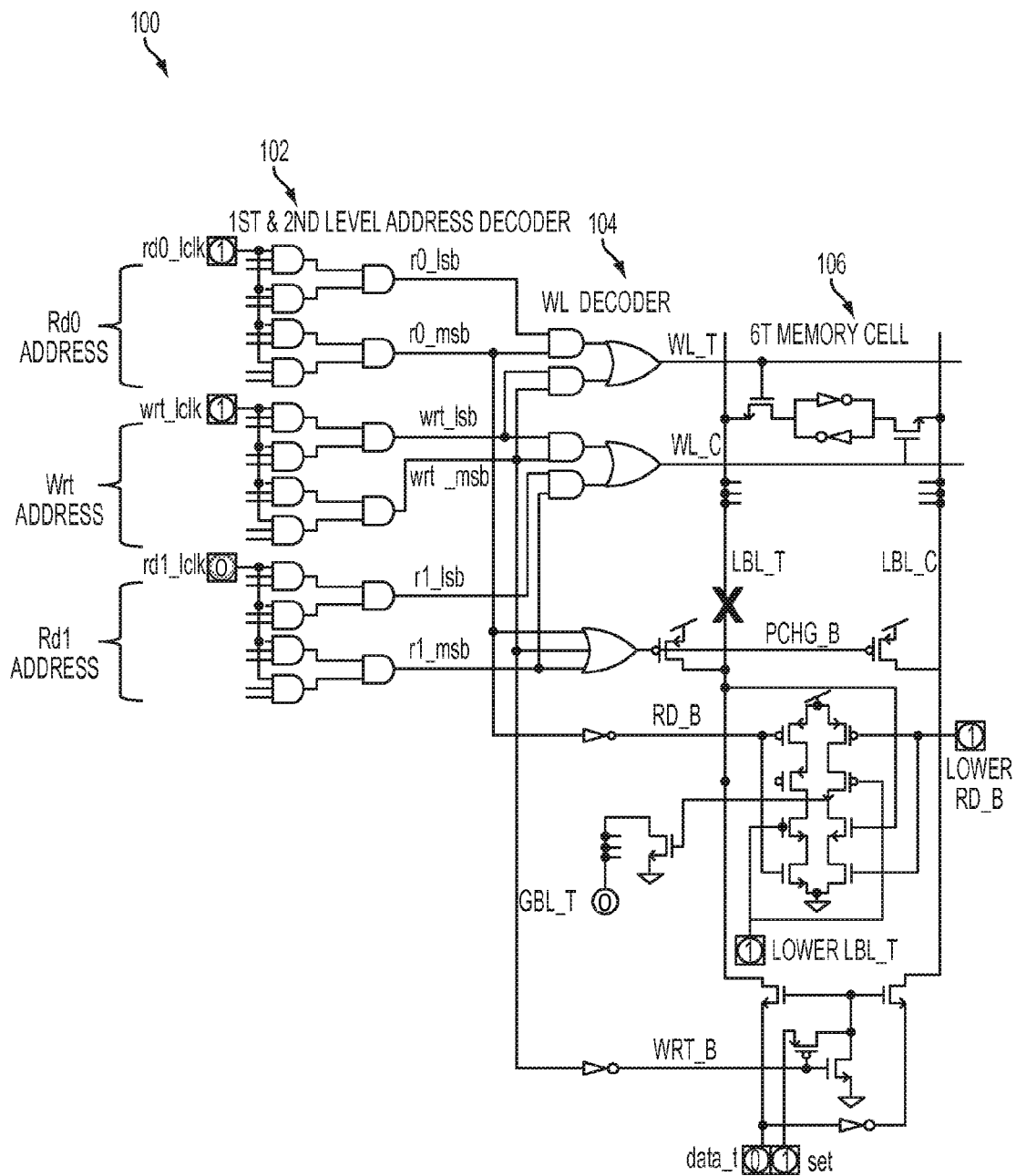
FIG. 1 is a schematic diagram of an exemplary memory architecture in which embodiments of the invention may be implemented.

Referring initially to FIG. 1, there is shown a schematic block diagram of an exemplary memory architecture 100 in which embodiments of the invention may be implemented. The memory architecture 100 may, for example, be a cache memory architecture such as an instruction cache (I-cache) or a branch target buffer (BTB), although the principles described herein are not so limited to these architectures. In the embodiment depicted, the memory architecture 100 is capable of implementing 2-port read and single port write using a banked approach. For example, each bank may include 16 logical entries, where 16 banks correspond to a total of 256 logical entries per 1 macro half. The local evaluate circuit topology controls the read and write of two consecutive banks with a most significant bit (MSB)-based read, write and restore controls, along with column specific set and data signals.

The memory architecture 100 supports a simultaneous 2-port read to any 2 addresses within a macro half (i.e., 256 entries), as well as a simultaneous write to 1 bank and 2 reads to different banks. As further illustrated in FIG. 1, a set of first and second level address decoders (AND gates) 102 receive a first 8-bit read address (Rd0), an 8-bit write address (Wrt) and a second 8-bit read address (Rd1). These addresses are dynamically decoded by the first and second level address decoders 102 via the respective local clock signals (rd0_lclk, wrt_lclk, rdl_lclk). The lower gates of the first and second level address decoders 102 decode the 4 most significant bits (MSB) of the 8-bit addresses and the upper gates of the first and second level address decoders 102 decode the 4 least significant bits (LSB) of the 8-bit addresses.

Wordline (WL) address decoders 104 are configured to select a wordline (WL_T, WL_C) for a given memory cell 106 by activating the associated access transistor. The resulting wordline is chosen by multiplexing the reads and write MSB/LSB address signals (r0_lsb, r0_msb, wrt_lsb, wrt_msb, r1_lsb, r1_msb) from the output of the first and second level address decoders 102. Additional circuitry associated with the memory architecture 100, such as precharging devices and bitline (data) read/write devices are not described in further detail herein, as they are known to one skilled in the art.

An address conflict for this architecture occurs when the macro receives both write and read addresses to the same bank. That is, if the same bank is selected for both reading and writing, then a conflict will result on the local bitline (LBL_T/LBL_C) such that the read address enables the memory cell content to be read onto the bitline while the write address enables the write data from the bitline to be written to the cell. Such a conflict situation is exemplified by the "X" shown on LBL_T of FIG. 1.

Figure 2:
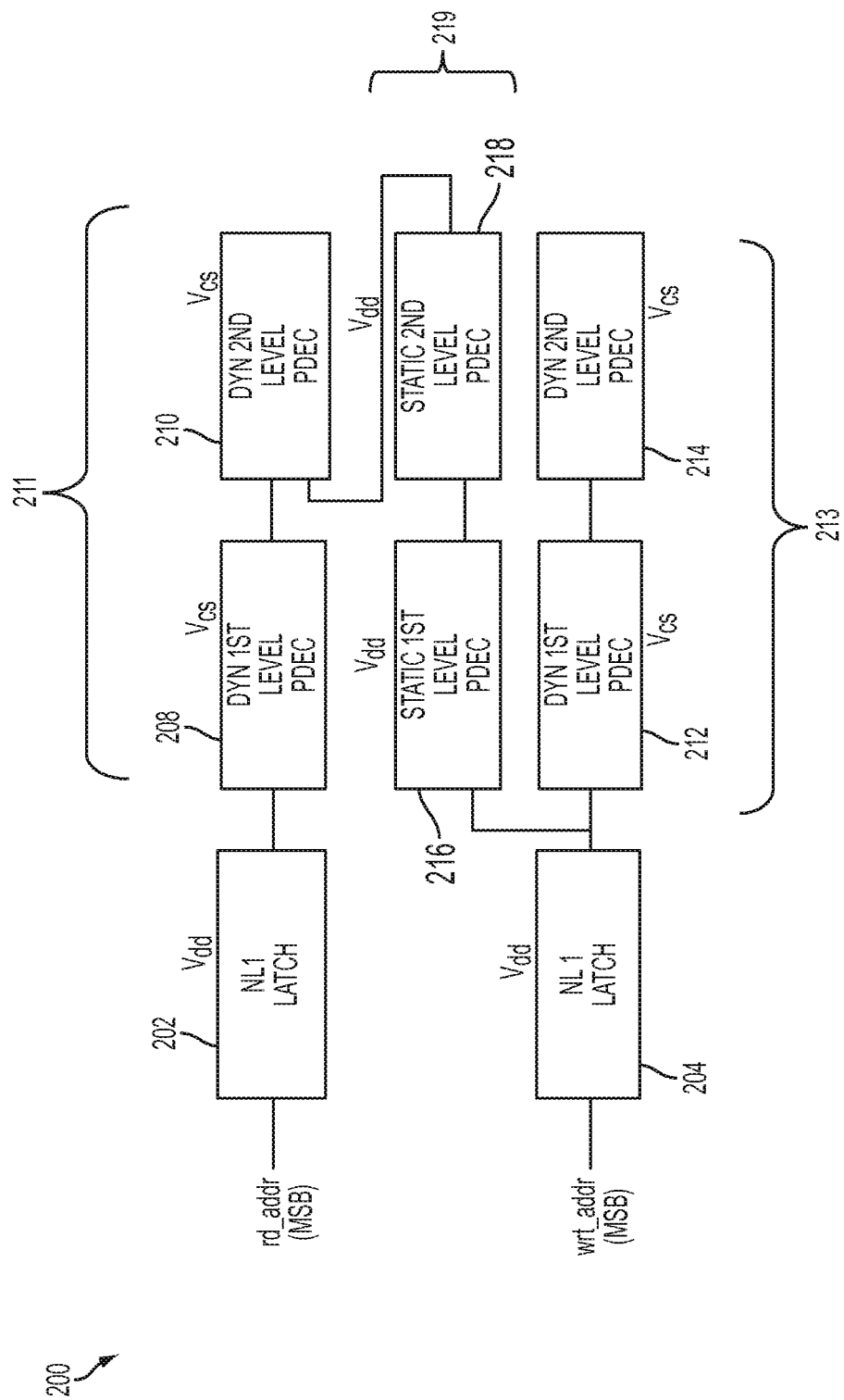
FIG. 2 is a schematic block diagram of a write block read apparatus that provides a parallel static decode path to generate a write address used for blocking, in accordance with an exemplary embodiment.

Referring now to FIG. 2, there is shown a schematic block diagram of a write block read apparatus 200 that provides a parallel static decode path to generate a write address used for blocking, in accordance with an exemplary embodiment. Generally stated, the write block read apparatus 200 statically decodes the write address MSB through the first and second level decode paths in parallel to the existing dynamic decode paths, beginning after the address latches. The resulting statically decoded write MSB is used to gate the read second level decode by introducing an additional device in the N-domino decode topology of the dynamic read second level decode circuitry as described in further detail below.

As shown in FIG. 2, the MSB of a read address and MSB of a write address are statically received in corresponding latches 202, 204. The first and second level dynamic predecoding circuitry (such as exemplified by 102 in FIG. 1) for the MSB of the read address is depicted in blocks 208, 210, respectively, which may collectively be referred to as a dynamic read address decoder 211. Similarly, the first and second level dynamic predecoding circuitry (such as exemplified by 102 in FIG. 1) for the MSB of the write address is depicted in blocks 212, 214, respectively, and may collectively be referred to as a dynamic write address decoder 213. As further shown in FIG. 2, there is also included the functionality of a parallel static decode path that includes a first level static predecode block 216 and a second level static predecode block 218. The first level static predecode block 216 is fed the MSB of the write address directly from the latches 204, and an output of the first level static predecode block 218 is coupled to the second level dynamic predecoding circuitry 210 of the read address. Collectively, blocks 216 and 218 may also be referred to as a static write address decoder 219.

In operation, the write block read apparatus 200 has priority to block a read operation when the write address MSB are equal to the read address MSB (i.e., when the write and read addresses correspond to the same bank). Moreover, through the use of the parallel static write address decoder 219, the dynamic write address decoder 213 remains dynamic to track with the dynamic read address decoder 211. As described in further detail below, an additional feature of the present embodiments is the use of a $V_{dd}$ (logic) voltage level signal to block a $V_{cs}$ (SRAM) voltage level signal. That is, two separate voltage domain levels are used in the present approach, wherein an exemplary logic rail voltage level may be $V_{dd}$=1.0 volts, and an exemplary memory rail voltage level may be $V_{cs}$=1.1 volts.

Figure 3:
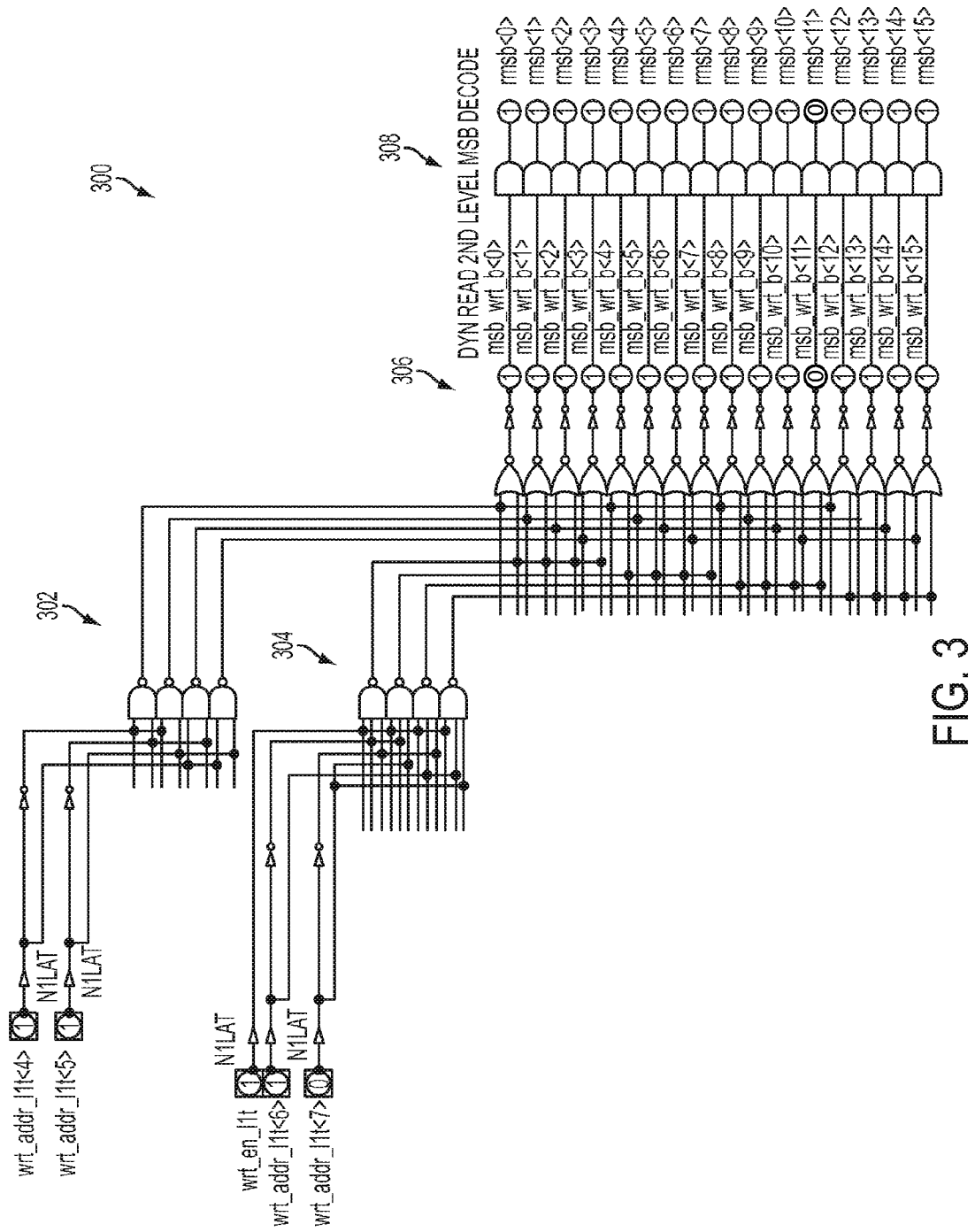
FIG. 3 is a schematic diagram of logic used to implement the write block read function, in accordance with an exemplary embodiment.

In further detail now, FIG. 3 is a schematic diagram of logic 300 used to implement the write block read function 200 of FIG. 2, in accordance with an exemplary embodiment. The logic 300 includes a first 2:4 decoding segment 302 that receives two of the four MSB from the write address latches (206, FIG. 2) and a second 2:4 decoding segment 304 that receives the other two of the four MSB from the write address latches. In addition, the second 2:4 decoding segment 304 receives a write enable signal (wrt_en) as a third input thereto, which if not enabled, prevents the logic 300 from blocking a read operation. The 2:4 decoding segments 302, 304 correspond to the first level static predecode block 216 shown in FIG. 2. Outputs from the 2:4 decoding segments 302, 304 are combined in a 4:16 decoding segment 306, which generates 16 output signals (msb_wrt_b<0> through msb_wrt_b<15>). The 4:16 decoding segment 306 corresponds to the second level static predecode block 218 shown in FIG. 2. These output signals are then dynamically ANDed with the predecoded read MSB, as shown at 308. If the wrt_en is enabled, and if the read address equals the write address, then a given msb_wrt_b signal will block generation of the read_msb of the same address with an active low logic level.

Figure 4:
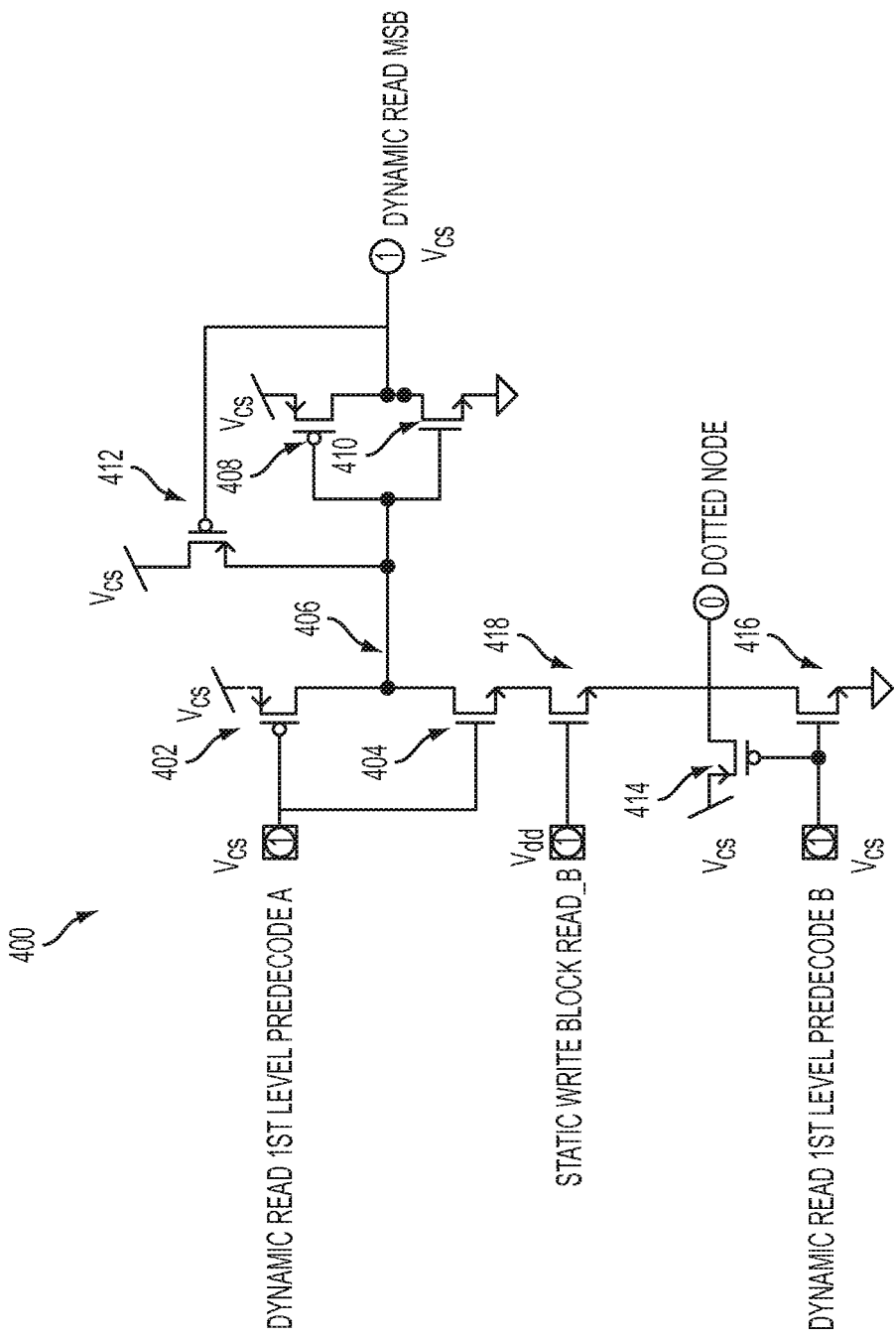
FIG. 4 is a schematic diagram of a dynamic AND gate configured to block read pre-decode signals using a signal from the write block read logic, in accordance with an exemplary embodiment.

Referring now to FIG. 4, there is shown a schematic diagram of an exemplary dynamic AND gate 400 (such as indicated at 308 in FIG. 3) configured to block read pre-decode signals using a signal from the write block read logic, in accordance with an exemplary embodiment. As is shown, the dynamic AND gate 400 receives, as inputs, not only the dynamic read first level predecode signals (A, B), but also a static write block read signal. The dynamic read first level predecode signal A is coupled to the inputs of PFET 402 and NFET 404, the drain terminals of which are coupled to a node 406. Node 406 in turn is coupled to an inverter stage comprising PFET 408 and NFET 410, the output of which is the dynamic read MSB. A keeper PFET 412 maintains the node 406 at a logic high value, unless discharged as a result of each of the input signals being at a logic high value as further described below. The dynamic read first level predecode signal B is coupled to the inputs of PFET 414 and NFET 416, the drain terminals of which are coupled to a node labeled "dotted node" in FIG. 4.

The devices described thus far in the dynamic AND gate 400 operate with the aforementioned memory rail voltage level $V_{cs}$. In addition, however, the static write block read_B signal (having a logic high value at the logic rail voltage level of $V_{dd}$) is coupled to an NFET 418 configured between the dotted node and NFET 404. In a "normal" or non-blocking mode of operation, the static write block read_B signal is maintained at an inactive or logic high level ($V_{dd}$). In other words, NFET 418 is rendered conductive in a non-blocking mode of operation such that the dynamic AND gate 400 acts as a conventional AND gate. For example, when the value of dynamic read first level predecode signal A is "0" (regardless of the value of dynamic read first level predecode signal B), PFET 402 is conductive and NFET 404 is non-conductive, thus charging node 406 to $V_{cs}$. As a result, the inverter stage 408/410 generates a "0" on the output of the gate.

Continuing with the non-blocking mode of operation, if the value of dynamic read first level predecode signal A is "1", then PFET 402 is non-conductive and NFET 404 is conductive, which may allow node 406 to be discharged from $V_{cs}$, depending upon the value of dynamic read first level predecode signal B. If dynamic read first level predecode signal B is "0", then PFET 414 is conductive and NFET 416 is non-conductive. Thus, there is no path to ground for the node 406 to be discharged, and it is maintained at $V_{cs}$ by PFET 414 and keeper PFET 412. On the other hand, if both dynamic read first level predecode signals A and B are "1" (again assuming a non-blocking mode), then each of the NFETs 404, 418 and 416 are conductive, providing a discharge path to ground for node 406. The relative strength of the NFET devices is sufficient to overcome the keeper PFET 412, which results in node 406 being discharged to ground and a "1" being generated on the output of the gate 400.

The particular placement of the NFET 418 in the pull-down stack between NFET 404 and NFET 416 allows an active low signal to render NFET 418 non-conductive, which cuts off a discharge path for node 406. Thus, even if both dynamic read first level predecode signals A and B are "1", if the static write block read_B signal is active low (i.e., a write block read condition), the node is maintained at $V_{cs}$ by PFET 412, meaning that the dynamic read MSB signal is blocked (i.e., kept low). Again, as stated above this blocking signal is statically decoded, at a $V_{dd}$ voltage level.

As will thus be appreciated, the above described embodiments implement a write block read addressing scheme internally to the macro but without using the actual write decode in the critical decode path for the address blocking. This results in avoiding the introduction of timing of complexity in the critical path, by specifically loading down the partially decoded write MSB signals with additional wire and device load. With respect to physical overhead M4 metal level wire tracks may be used to deliver long static decode signals to second level read circuits. The static write blocking signal must encapsulates the dynamic read first level decode signals arriving at the read second level decoder, meeting setup and hold requirements.

Further, the introduction of additional devices/static signals in the read decode stack enables the blocking function, with a separate static path enabling custom tuning to meet setup/hold requirements. The blocking function blocks a $V_{cs}$ (SRAM voltage level) based dynamic decode, using a $V_{dd}$ (logic voltage) based signal. Through the use of parallel write static and decode paths, the write static decode path maintains the same number of stages as the dynamic read and write decode paths for better tracking of timing.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A write block read apparatus for a memory device, the apparatus comprising:
   a dynamic read address decoder that receives static read address bits as inputs thereto and having an output used to implement a read operation of a memory location corresponding to the read address bits;
   a dynamic write address decoder that receives static write address bits as inputs thereto and having an output used to implement a write operation of a memory location corresponding to the write address bits; and
   a static write address decoder, configured in parallel with the dynamic write address decoder, the static write address decoder configured to receive a portion of the static write address bits as inputs thereto, and wherein the static write address decoder is coupled to the dynamic read address decoder so as to block the read operation upon an address conflict with the write operation, wherein the address conflict occurs when a group of most significant bits of the static write address bits equals a group of most significant bits of the static read address bits, wherein:
   an output of the static write address decoder is coupled to a dynamic AND gate of the dynamic read address decoder;
   the dynamic read address decoder comprises first and second level read predecode circuitry, the first level read predecode circuitry receiving each of the static write address bits as inputs thereto, and the second level read predecode circuitry including the dynamic AND gate; and
   the static write address decoder receives the group of most significant bits of the static write address bits as inputs thereto.

2. The apparatus of claim 1, wherein the static write address decoder operates at a first supply voltage for logic devices and the dynamic read and write address decoders operate at a first supply voltage for memory devices.

3. The apparatus of claim 1, wherein the output of the static write address decoder is coupled to an NFET included in a pull-down stack of the dynamic AND gate such that when the output of the static write address decoder is active low, the NFET is rendered non-conductive, and the output of the dynamic read address decoder is blocked.

4. The apparatus of claim 1, wherein the group of most significant bits of the static write address bits comprises the four most significant bits of eight, and the group of most significant bits of the static read address bits comprises the four most significant bits of eight.

5. The apparatus of claim 4, wherein the static write address decoder comprises a first 2:4 decoding segment that receives two of the four most significant bits of the static write address bits as inputs thereto and a second 2:4 decoding segment that receives the other two of the four most significant bits of the static write address bits as inputs thereto.

6. The apparatus of claim 5, wherein the second 2:4 decoding segment receives a write enable signal as a third input thereto, which when not enabled, prevents the static write address decoder from blocking a read operation.

7. The apparatus of claim 1, wherein the memory device comprises a 2-port read, single port write configuration having a banked architecture.

8. A write block read apparatus for a memory device, the apparatus comprising:
   a dynamic read address decoder that receives static read address bits as inputs thereto and having an output used to implement a read operation of a memory location corresponding to the read address bits;
   a dynamic write address decoder that receives static write address bits as inputs thereto and having an output used to implement a write operation of a memory location corresponding to the write address bits; and
   a static write address decoder, configured in parallel with the dynamic write address decoder, the static write address decoder configured to receive a portion of the static write address bits as inputs thereto, and wherein the static write address decoder is coupled to the dynamic read address decoder so as to block the read operation upon an address conflict with the write operation, wherein the address conflict occurs when a group of most significant bits of the static write address bits equals a group of most significant bits of the static read address bits, wherein:

the group of most significant bits of the static write address bits comprises the four most significant bits of eight, and the group of most significant bits of the static read address bits comprises the four most significant bits of eight;

the static write address decoder comprises a first 2:4 decoding segment that receives two of the four most significant bits of the static write address bits as inputs thereto and a second 2:4 decoding segment that receives the other two of the four most significant bits of the static write address bits as inputs thereto; and the second 2:4 decoding segment receives a write enable signal as a third input thereto, which when not enabled, prevents the static write address decoder from blocking a read operation.

\* \* \* \* \*